US006791372B2

(12) United States Patent
Jaussi

(10) Patent No.: US 6,791,372 B2
(45) Date of Patent: Sep. 14, 2004

(54) ACTIVE CASCODE DIFFERENTIAL LATCH

(75) Inventor: James E. Jaussi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/163,178

(22) Filed: Jun. 4, 2002

(65) Prior Publication Data

US 2003/0222680 A1 Dec. 4, 2003

(51) Int. Cl.[7] .................................................. H03K 5/22

(52) U.S. Cl. ............................ 327/65; 327/67; 327/57; 327/55; 327/552

(58) Field of Search ............................. 327/51, 52, 55, 327/57, 63, 65, 67, 208, 210, 211, 212, 214, 218, 551, 552, 563; 365/205, 207

(56) References Cited

U.S. PATENT DOCUMENTS 5,847,598 A * 12/1998 Sone .......................... 327/563
6,215,331 B1 * 4/2001 Setty et al. ................... 327/51
6,288,575 B1 * 9/2001 Forbes ........................ 327/57
6,373,292 B1 * 4/2002 Choe .......................... 326/121
6,424,181 B1 * 7/2002 Pogrebnoy ................... 327/55
6,449,191 B1 9/2002 Lin et al. .................... 365/205

* cited by examiner

*Primary Examiner*—Long Nguyen
(74) *Attorney, Agent, or Firm*—Seth Z. Kalson

(57) ABSTRACT

An active cascode differential latch for providing a logic output signal indicative of whether or not a first current is greater than a second current. The first and second currents are fed into two input ports of the active cascode differential latch. The active cascode differential latch has a relatively small input impedance, and has utility for comparators and discrete-time analog filters, to name just a few, particularly when used in high bandwidth and low voltage applications.

10 Claims, 13 Drawing Sheets

ACTIVE CASCODE DIFFERENTIAL LATCH

FIELD

Embodiments of the present invention relate to analog circuits, and more particularly, to an active cascode differential latch, useful for discrete-time analog filters.

BACKGROUND

FIG. 1 provides a high-level abstraction of a portion of a computer server or system, where microprocessor 102 resides on board 104 and communicates with memory 106 on board 108. The communication is by way of striplines on backplane 110. Backplane 110 is connected to boards 104 and 108 by connectors 112. Not shown in FIG. 1 are other memory units and microprocessors, where the various microprocessors and memory units may communicate to one another so as to access or write data and instructions.

Communication of signals over backplane 110 may be modeled by transmission line theory. Often, the signaling is based upon differential signaling, whereby a single bit of information is represented by a differential voltage. For example, FIG. 2*a* shows drivers 202 and 204 driving transmission lines 206 and 208, respectively. For differential signaling, drivers 202 and 204 drive their respective transmission lines to complementary voltages. Typical curves for the node voltages at nodes n1 and n2 for a bit transition are provided in FIG. 2*b*, where the bit transition is indicated by a dashed vertical line crossing the time axis. The information content is provided by the difference in the two node voltages.

For short-haul communication, such as for the computer server in FIG. 1, the signal-to-noise ratio is relatively large. If the transmission lines are linear, time-invariant systems having a bandwidth significantly greater than that of the transmitted signal, then a relatively simple receiver architecture may be employed to recover the transmitted data. Such a receiver is abstracted by comparator 210, which provides a logic signal in response to the difference in the two received voltages at ports 212 and 214.

However, every transmission line has a finite bandwidth, and for signal bandwidths that are comparable to or exceed the transmission line (channel) bandwidth, intersymbol interference may present a problem. Furthermore, actual transmission lines may have dispersion, whereby different spectral portions of a signal travel at different speeds. This may result in pulse spreading, again leading to intersymbol interference. As a practical example, for high data rates such as 10 Gbs (Giga bits per second), the transmission lines used with backplanes or motherboards are such that intersymbol interference is present.

Channel equalization is a method in which a filter is employed at a receiver so as to equalize the channel. The use of digital filters for channel equalization is well known. However, digital filters for such applications require an analog-to-digital converter, which may be costly and difficult to implement at high data rates, and the digital filtering itself may be difficult to implement at high data rates. Consequently, there has been an interest in analog filters for channel equalization. The design of analog filters for channel equalization with high data rates such as 10 Gbs may be challenging. Furthermore, in many high performance applications, the supply voltage is scaling to lower and lower values. This further challenges the circuit designer because of the reduced voltage headroom.

DESCRIPTION OF EMBODIMENTS

Figure 3:
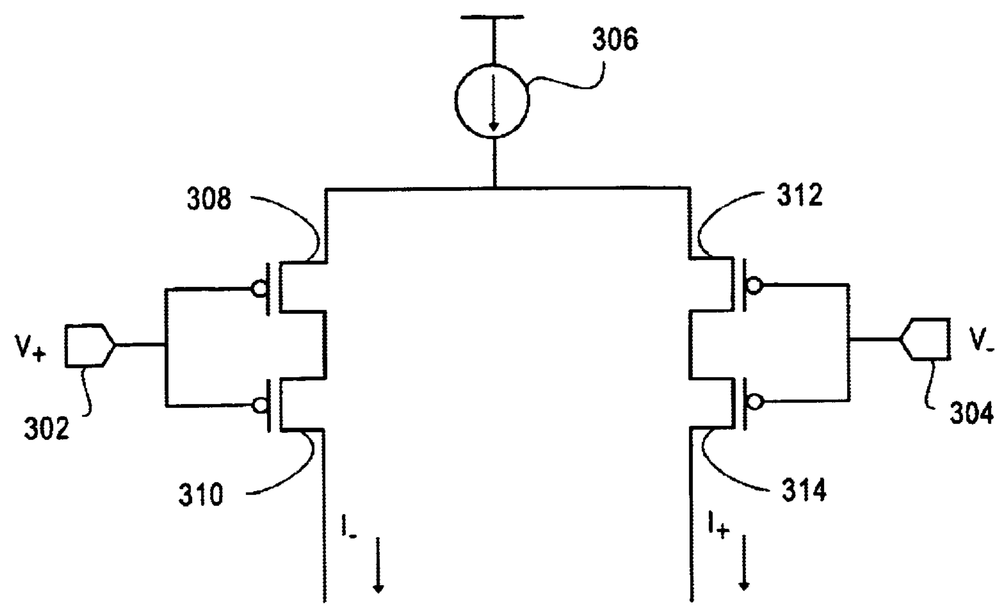
FIG. 3 is a voltage-to-current converter at the circuit level.

FIG. 3 provides at the circuit level a voltage-to-current (V-I) converter according to an embodiment of the present invention. A differential voltage signal is applied to input ports 302 and 304. Current source 306 provides bias current to a differential pair comprising pMOSFETs 308, 310, 312, and 314. The gates of pMOSFETs 308 and 310 are connected to input port 302, and the gates of pMOSFETs 312 and 314 are connected to input port 304. The combination of pMOSFET 308 to pMOSFET 310 looks like a classical cascode pair, save for the fact that the gate of pMOSFET 308 is not at a fixed voltage. A similar statement applies to the combination of pMOSFET 312 and pMOSFET 314. Accordingly, the V-I converter of FIG. 3 may be termed an active cascode V-I converter.

The betas of pMOSFET 308 and 310 may be chosen such that the active cascode configuration of pMOSFETs 308 and 310 forces pMOSFET 308 to operate in the triode region when pMOSFET 310 is in its active region. A similar statement applies to the combination of pMOSFETs 312 and 314. This may be observed as follows. Let $V_{S2}$ denote the source voltage of pMOSFET 310 and $V_{S1}$, denote the source voltage of pMOSFET 308. With pMOSFET 310 in its active region, $V_{S2}>V_g+|V_T|$, where $V_g$ is the gate voltage and $V_T$ is the threshold voltage. (For simplicity, we take the threshold voltage to be the same for pMOSFET 308 and 310.) Simple manipulation of the previous inequality yields $V_{GT}>V_{DS}$, where $V_{GT}$ is defined as $V_{S1}-V_g-|V_T|$ and $V_{DS}$ is the drain-source voltage $V_{S1}-V_{S2}$, which indicates that pMOSFET 308 operates in its triode region.

With pMOSFETs 308 and 312 operating in the triode region, they act approximately as resistors to degenerate pMOSFETs 310 and 314, respectively. Degeneration provides a relationship between the differential input voltage $V_{IN}=V_+-V_-$ and the differential current $I_{OUT}=I_+-I_-$ that is linear over a wider range than if degeneration was not present. ($I_+$ is the drain-source current for pMOSFETs 308 and 310, and I_ is the drain-source current of pMOSFETs 312 and 314, respectively.) This is seen by considering a simple low frequency small-signal T-model for the active cascode V-I converter of FIG. 3, where it is easily shown that the input-output relationship between differential current and voltage is given by $I_{OUT}=g_{eff}V_{IN}$. Here, the effective transconductance $g_{eff}$ is given by $g_{eff}=1/(r_s+r_L)$, where $r_s=1/g_m$, the reciprocal of the small-signal transconductance $g_m$ for pMOSFETs 310 and 314, and $r_L$ is the triode region drain-source resistance for pMOSFETs 308 and 312. (For simplicity, we assume that the differential pair is matched.) If pMOSFETs 308 and 312 were not present, then the simple T-model provides $I_{OUT}=g_mV_{IN}$. Clearly, $g_{eff}<g_m$, so that degeneration lowers the effective transconductance. However, $r_s$ is a function of the input voltage, and it is seen that because $g_{eff}=1/(r_s+r_L)$, there is less variation in $g_{eff}$ with input voltage than for $g_m$.

It should be noted that the differential pair provided in FIG. 3 has been studied within the context of a differential amplifier, where the drains of pMOSFETs 310 and 314 are coupled to active loads. In such a case, degeneration increases the output impedance. Amplifier gain is given by the product of the effective transconductance with the output impedance. It is found that degeneration lowers the effective transconductance more than it increases the output impedance, so that amplifier gain is not increased by degeneration. However, although the active cascode differential pair of FIG. 3 may not be the best choice for amplifiers, it is proposed in these letters patent that because degeneration increases the range over which the relationship between differential voltage and current is linear, the active cascode differential pair of FIG. 3 may be effectively used with a current multiplier to perform a discrete-time analog filter.

Figure 4:
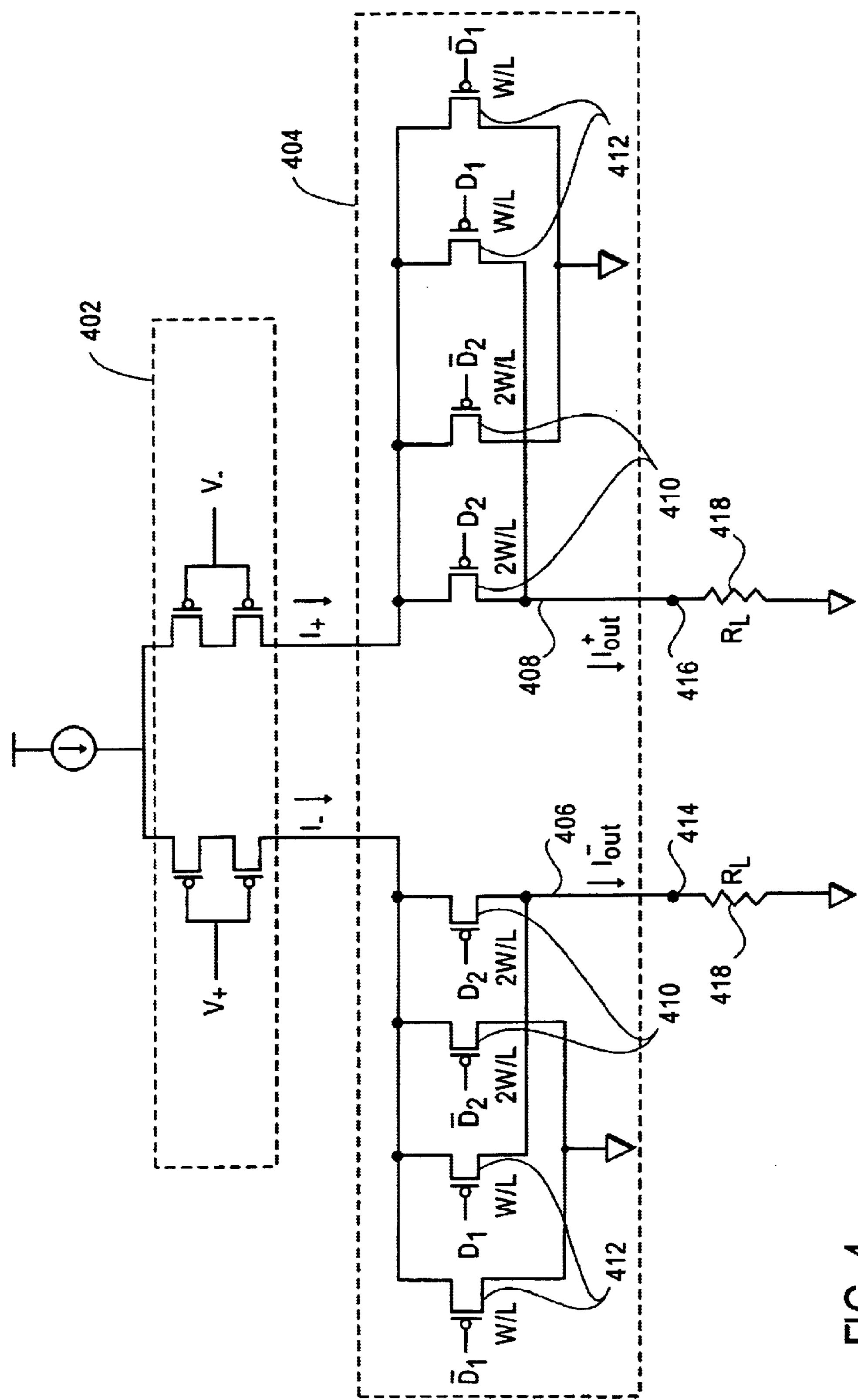
FIG. 4 is a voltage-to-current converter and current multiplier at the circuit level to effectuate a filter tap.

FIG. 4 provides at the circuit level a V-I converter with current multiplier according to an embodiment of the present invention. For simplicity, only a 2-bit current multiplier is shown, but upon considering FIG. 4 and reading the description, it should be straightforward how a current multiplier for any number of bits may be implemented. The circuit of FIG. 4 comprises V-I converter 402 coupled to current multiplier 404. Current multiplier 404 may considered as a digital-to-analog converter, because the currents $I_{OUT}^-$ and $I_{OUT}^+$ at output ports 406 and 408, respectively, are analog signals modulated by the control signals $D_1$ and $D_2$ applied to the gates of the pMOSFETs in current multiplier 404. Note that $\overline{D}_i$ denotes the Boolean complement of $D_i$.

Current multiplier 404 shunts to ground varying amounts of current, depending upon the control signals $D_1$ and $D_2$. In the particular embodiment shown in FIG. 4, pMOSFETs 410 have a channel width-to-length ratio twice that of pMOSFETs 412. When $D_1$ and $D_2$ are both HIGH, current from V-I converter 402 is shunted to ground, and the multiplication value is zero. When $D_1$ is LOW and $D_2$ is HIGH, currents at ports 406 and 408 receive ⅓ of the currents from V-I converter 402, and the effective multiplication value is one. When $D_1$ is HIGH and $D_2$ is LOW, ⅔ of the currents from V-I converter 402 is passed through to ports 406 and 408, and the effective multiplication value is two. When both $D_1$ and $D_2$ are LOW, the currents at all of the currents from V-I converter 402 are passed through current multiplier 404, and the effective multiplication is three. In this way, 2-bit multiplication is realized.

Note that the difference in voltages at nodes 414 and 416 represent the multiplication, where the currents at ports 406 and 408 are fed into resistive loads 418. In practice, loads 418 may be realized by active devices, to be described later. If the voltage at node 414 subtracted from the voltage at node 416 represent a weight, then a weight having the opposite sign is realized by subtracting the voltage at node 416 from the voltage at node 414. Also, it is to be noted that the channel width-to-length ratios for the pMOSFETs used in the current multiplier need not be powers of two. That is, it is not necessary that multiplication be performed in binary arithmetic. More generally, a mapping is provided between control signals and currents passed through the current multiplier, and it is not necessary that this mapping represent any particular arithmetic.

Figure 1:
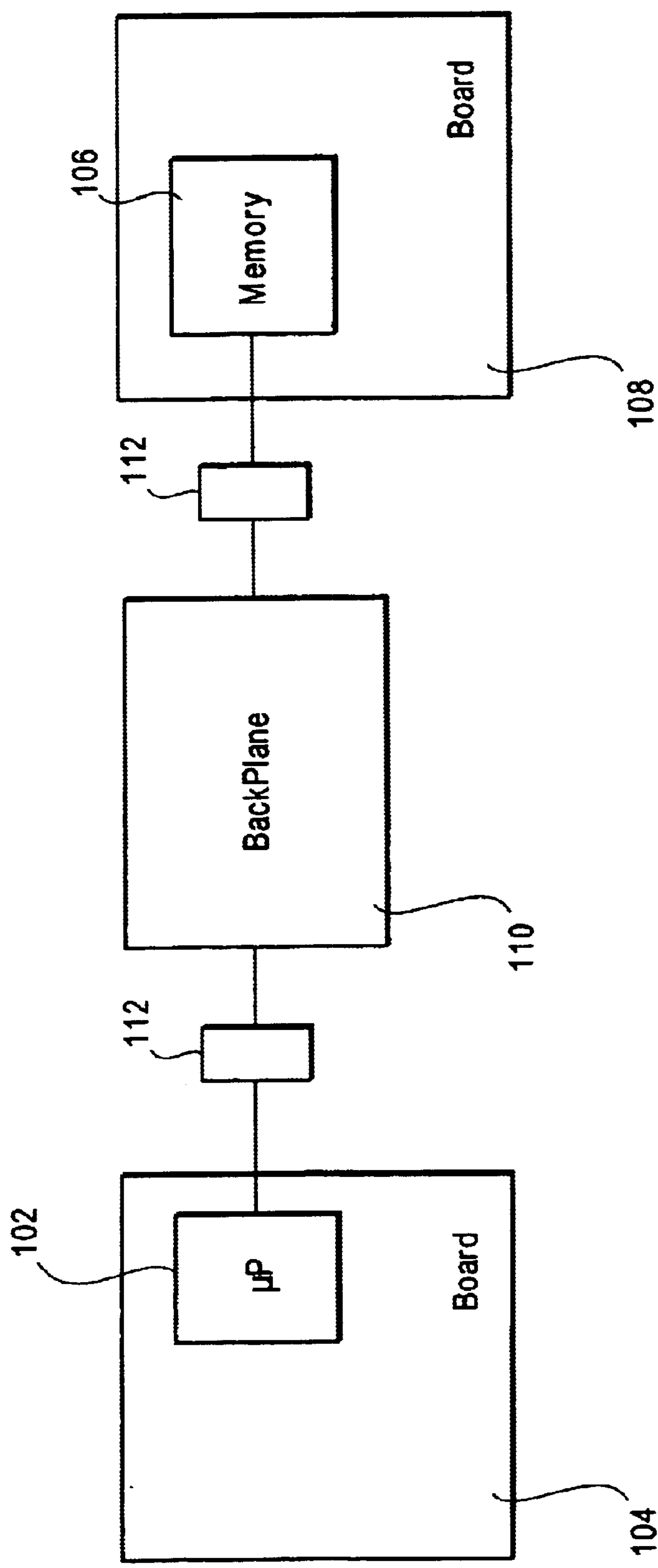
FIG. 1 is a high-level abstraction of a server system, illustrating signaling between boards via a backplane.
Figure 2A:
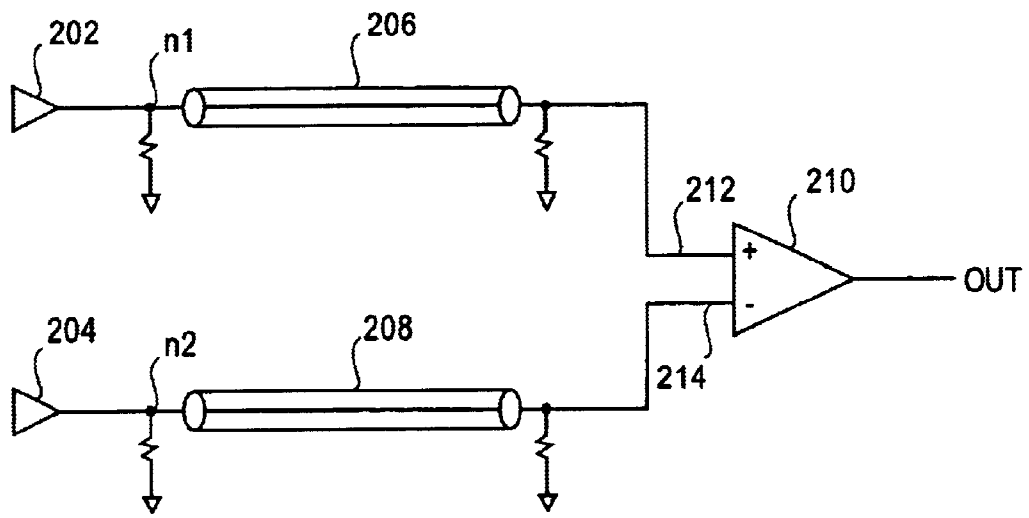
FIG. 2*a* illustrates differential signaling on two transmission lines.
Figure 2B:
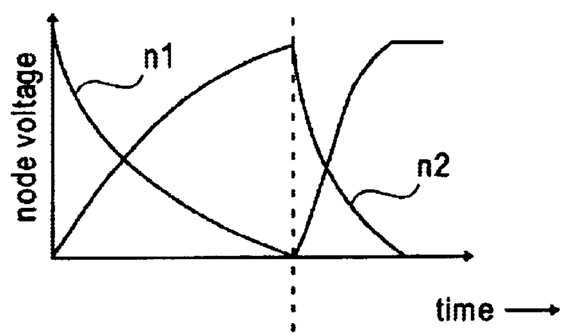
FIG. 2*b* shows typical voltage curves representing differential signaling on the transmission lines of FIG. 2*a*.
Figure 5:
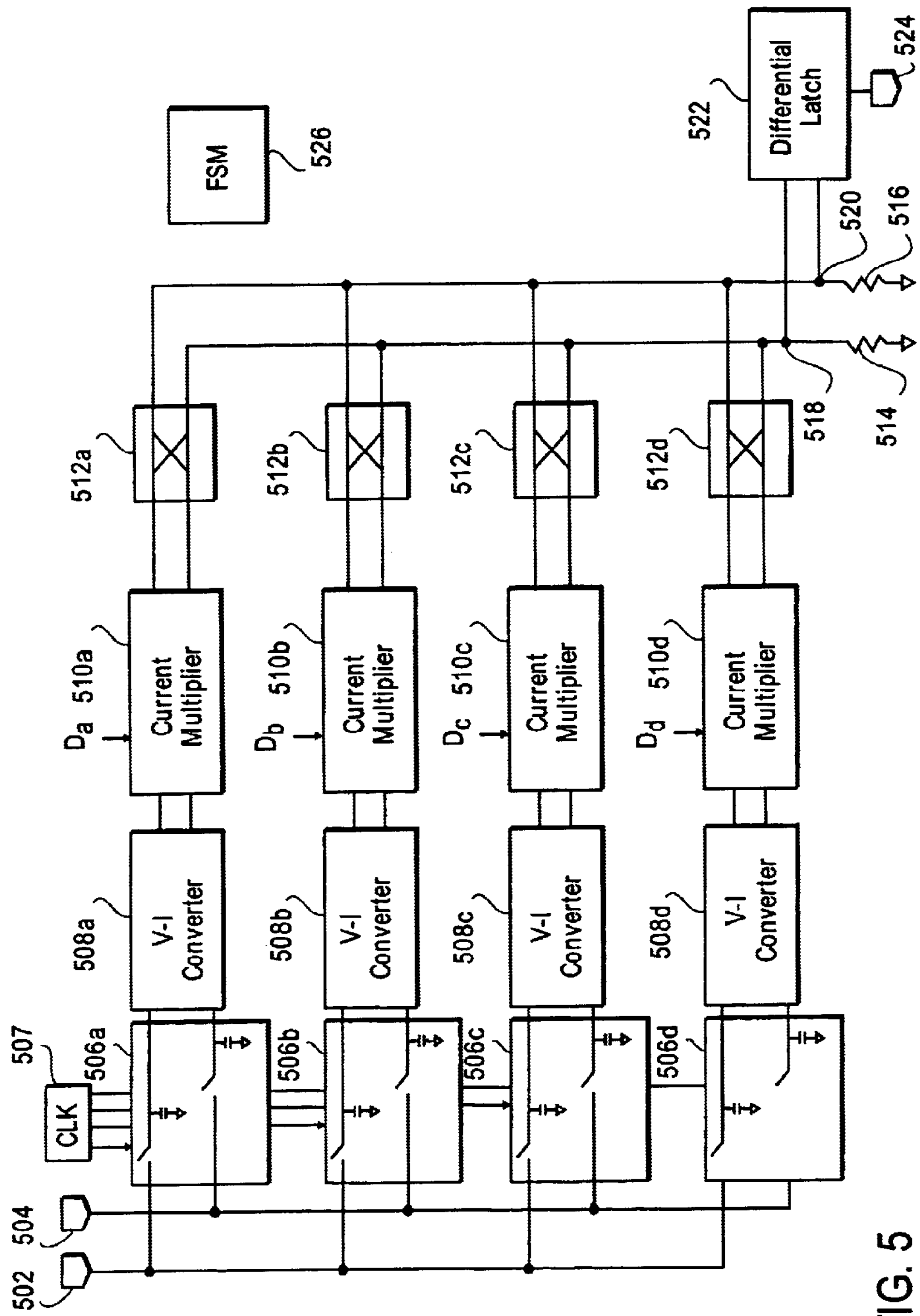
FIG. 5 is an analog FIR filter of order 2 at the circuit sub-block level.

The combination of the V-I converter and current multiplier in FIG. 4 realizes a weighting of the input differential voltage to the V-I converter. This combination of V-I converter and current multiplier, along with loads 418, are realized as a single stage. Utilizing a single stage helps in filtering high data rate signals. A plurality of such combinations may be employed to realize a FIR (Finite Impulse Response) filter. For example, consider a FIR filter realized in FIG. 5. Input ports 502 and 504 receive an input differential voltage from a transmission line, such as that illustrated in FIG. 2. Sample-and-Hold (SH) circuits 506*a–d* sample and hold the received differential signal. For simplicity, each SH circuit in FIG. 5 is shown as two switches (e.g., pass gates), each connected to a capacitor to store the received differential voltage. Other embodiments may employ other types of SH circuits. A clock phase generator 507 provides clock signals at various phases for each SH circuit. The clocking of the SH circuit will be described later. Each SH circuit is followed by one of V-I converters 508*a–d*. Each V-I converter is followed by one of current multipliers 510*a–d*. Each current multiplier has a set of control voltages to perform the suitable weighting (current multiplication). That is, a set of control voltages denoted by $D_a$ is applied to current multiplier 510*a*. Similar statements apply to the other current multipliers. Each current multiplier is followed by one of switches 512*a–d*. These switches are two-by-two crossbar switches, so that for each switch, one of the two input ports is connected to one of the two output ports, with the other input port connected to the other output port. In this way, sign information is realized, as discussed with respect to FIG. 4. Current is sunk into loads 514 and 516, which are shown as simple resistors in FIG. 5. (Another embodiment for the loads is described later.) The voltages developed at nodes 518 and 520 are sensed by differential latch 522, which provides a logic signal at output port 524 indicative of the voltage difference at nodes 518 and 520.

The analog FIR filtering is represented by the differential voltage at nodes 518 and 520. Differential latch 522 effectively performs a decision, converting the analog information represented by the voltages at nodes 518 and 520 into a logic signal, indicative of whether a "1" or "0" was most likely transmitted. To account for "pre-cursors" and "post-cursors", where a received signal at time t has inter-symbol interference from signals representing bit-times at times earlier and later than t, the logic signal provided by the differential latch at some time t may represent an estimate of the transmitted signal at a time earlier to t. That is, if s[i] is the received sequence, where i is an integer index representing time in some appropriate unit, then the filter weights may be synthesized such that the differential latch output at time n is an estimate of the transmitted bit at time n-m, where m is an integer.

In the embodiment of FIG. 5, a FIR filter of order 2 is realized. At any given bit-time, say at time t=n where n is an integer, one of the SH circuits has its switches closed to provide the next sample, say s[n+1], whereas the other three SH circuits hold the three most recent samples, s[n], s[n−1], and s[n−2]. Control signals are provided to the current multipliers corresponding to the three most recent samples to effectuate the FIR filtering, and the control signals for the current multiplier corresponding to the next sample s[n+1] are such that zero weighting is applied because s[n+1] is not yet completely acquired. At the next bit-time, t=n+1, the sample s[n+1] is available, the control signals are rotated (circularly shifted) with respect to the current multipliers, and the SH circuit corresponding to the next sample s[n+2] has its switches closed. This process is repeated each bit-time, where the timing of the SH circuits is such that only one of them has its switches closed during a bit-time, and the control voltages are circularly shifted from one current multiplier to the next in a sequential manner.

The above description regarding the timing of the sample-and-hold operations and the shifting of control signals for the embodiment of FIG. 5 is perhaps best made clear by considering FIGS. 6*a* through 6*d*. In FIGS. 6*a–d*, FIR filtering is abstracted to multiplication units followed by a summer unit. A multiplication unit comprises a V-I converter and a current multiplier. A multiplication unit may be referred to as either a filter tap, or simply a multiplier. The filter weights are denoted by h[0], h[1], and h[2]. (For simplicity, FIGS. 6*a–d* show single-ended signaling, but its generalization to differential signaling should be obvious to one of ordinary skill in the relevant art.)

Figure 6A:
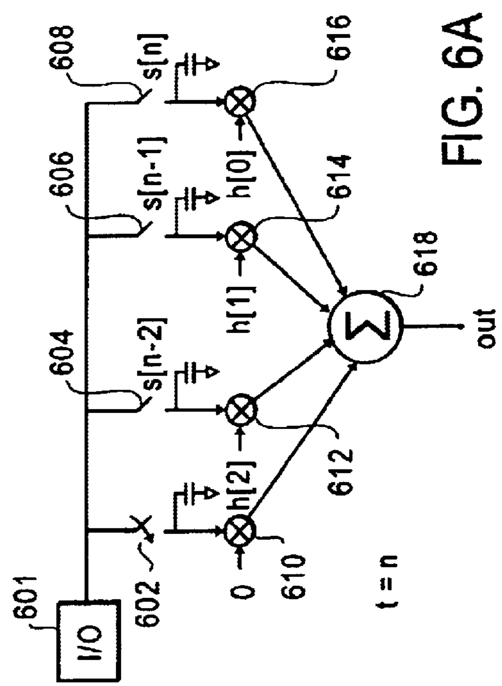
FIGS. 6*a* through 6*d* provide timing information for the filter of FIG. 5.

In FIG. 6*a*, the time index is t=n, and switch 602 is closed to acquire the next sample, s[n+1], from input-output (I/O) pad 601. Switches 604, 606, and 608 have already acquired samples s[n−2], s[n−1], and s[n], respectively. The weight for multiplier 610 is zero because switch 602 is in the process of acquiring sample s[n+1]. The weights for multipliers 612, 614, and 616 are the filter weights h[2], h[1], and h[0], respectively. The analog filtered output is provided by summer 618.

Figure 6B:
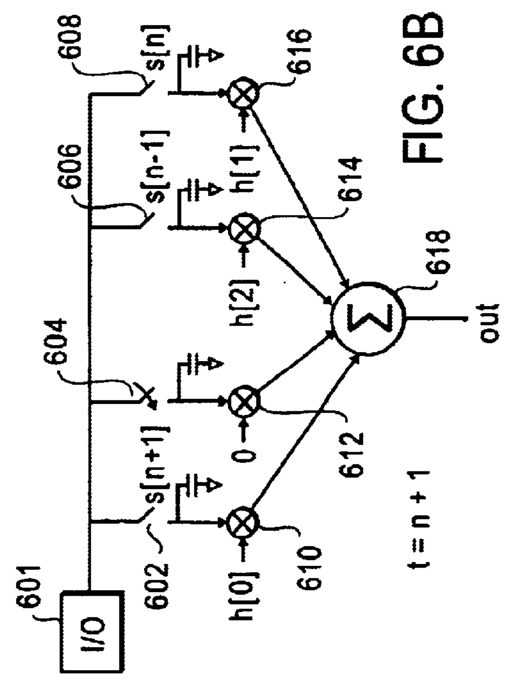
Figure 6C:
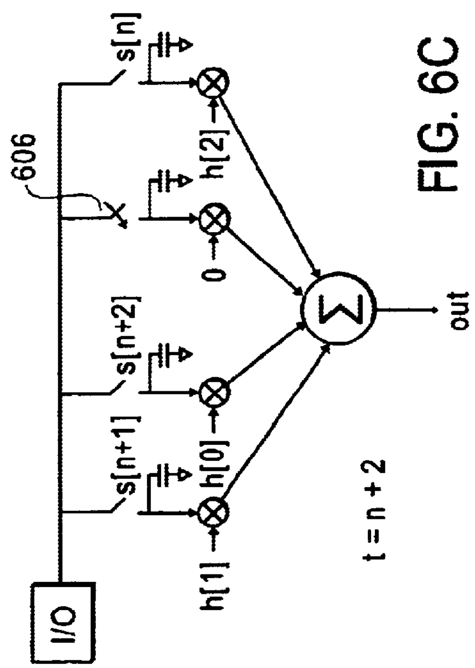
Figure 6D:
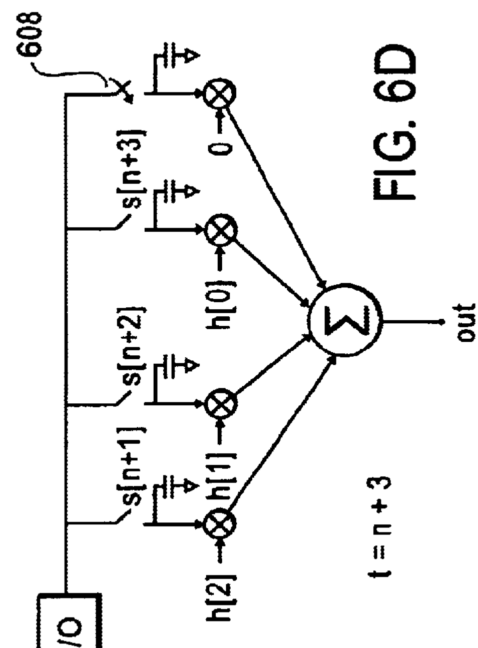

For FIG. 6*b*, the time index is t=n+1, and switch 602 is now opened because it has acquired sample s[n+1]. Switch 604 is now closed to acquire the next sample, s[n+2], and a zero weight is applied to its corresponding multiplier, 612. The filter weights have been circularly shifted when compared to FIG. 6*a*, where weight h[0] is applied to multiplier 610, and weights h[2] and [1] are applied to multipliers 614 and 616, respectively. In FIG. 6*c*, the time index is t=n+2, and switch 606 is closed to acquire the next sample, s[n+3]. Comparing FIG. 6*c* to FIG. 6*b*, it is seen that the filter weights have again been circularly shifted. In FIG. 6*d*, the time index is t=n+3, switch 608 is closed to acquire the next sample, s[n+4], and the weights have again been circularly shifted. The cycle indicated by FIGS. 6*a–d* is repeated. In this way, convolution is performed, where at each bit time, one of the SH circuits is acquiring the next sample, and the filter weights are circularly shifted to effectuate the convolution.

Note from FIGS. 6*a–d* that the sequence of switching the SH circuits and the sequence of applying the filter weights is such that circular shifting is employed. However, any repeating sequence for switching and shifting may be utilized, so long as the filter weights are applied to the appropriate multipliers at the appropriate time to effectuate the correct convolution.

As the filter weights are shifted to various multipliers, it may be necessary to control switches 512*a–d* to account for the sign of the shifted weights. The control of switches 512*a–d*, as well as the timing of SH circuits 507 and the shifting of control voltages to current multipliers 510*a–d*, may be implemented by finite state machine 526. Other methods may be employed, for example, a memory table may be used to store the control signals.

In the particular embodiment of FIG. 5, switches 512*a–d* were placed after current multipliers 510*a–d*. However, because of linearity, it is to be noted that switches 512*a–d* may be placed elsewhere in the sub-circuit "chains". For example, these switches may be placed before the SH circuits, before the V-I converters, or before the current multipliers.

The presence of switches 512*a–d* for implementing sign changes and the shifting of filter weights among the various filter taps adds to system complexity. However, filter structures may be employed where the multipliers are repeated, so that switches 512*a–d* are not required and the filter weights need not be shifted.

Figure 7:
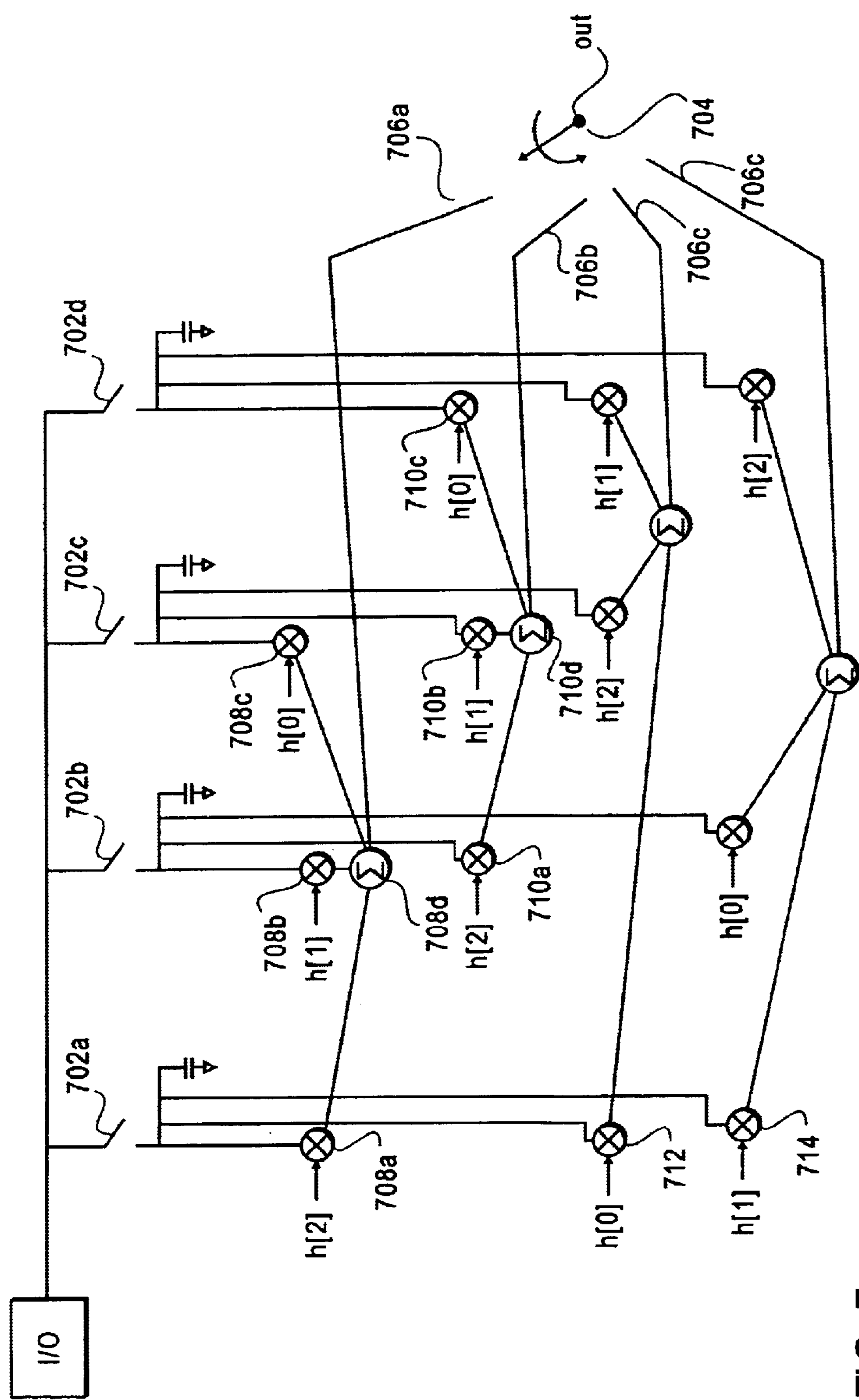
FIG. 7 is a filter architecture without weight shifting.

Indeed, note that FIGS. 6*a–d* show four time "snapshots" of the filter weight positions. Inspection of FIGS. 6*a–d* results in the filter structure of FIG. 7. In FIG. 7, SH circuits 702*a–d* are switched in a sequential manner, so that one of them is closed during any given bit duration to acquire the next sample, where the other three have already required the three most recent samples. Switch 704 is also switched among ports 706*a–d* every bit time to provide the filtered output. (Again, for simplicity, the filter structure of FIG. 7 is single-ended, but its generalization to differential signaling should be obvious.)

For example, if SH circuits 702*a–c* have acquired their respective samples and SH circuit 702*d* is closed to acquire the next sample, then multipliers 708*a–c* and summer 708*d* provide the filtered output to port 706*a*, and switch 704 switches to port 706*a*. At the next bit time, SH circuit 702*a* closes to acquire the next sample, and SH circuits 702*b–d* have acquired the next most three recent samples, so that multipliers 710*a–b* and summer 710*d* provided the filtered output at port 706*b*. This process continues, providing a filtered output at port 706*c* and then next at port 706*c*, and then the process repeats itself.

The filter structure of FIG. 7 may be viewed as comprising four sub-filters. For example, multipliers 708*a–c* and summer 708*d* together provide one of the four sub-filters. A summer associated with a sub-filter may be operated at a rate slower than a bit-time. For example, when SH circuit 702*c* has acquired a sample, taps 708*a–c* have one bit-time to process data before switch 702*a* is closed to begin another acquisition. However, provided the differential latch in summer 708*d* has begun evaluation after one bit-time, it may be given further time to complete its evaluation to provide its output logic signal, up to a total of 4 bit-times.

Figure 8:
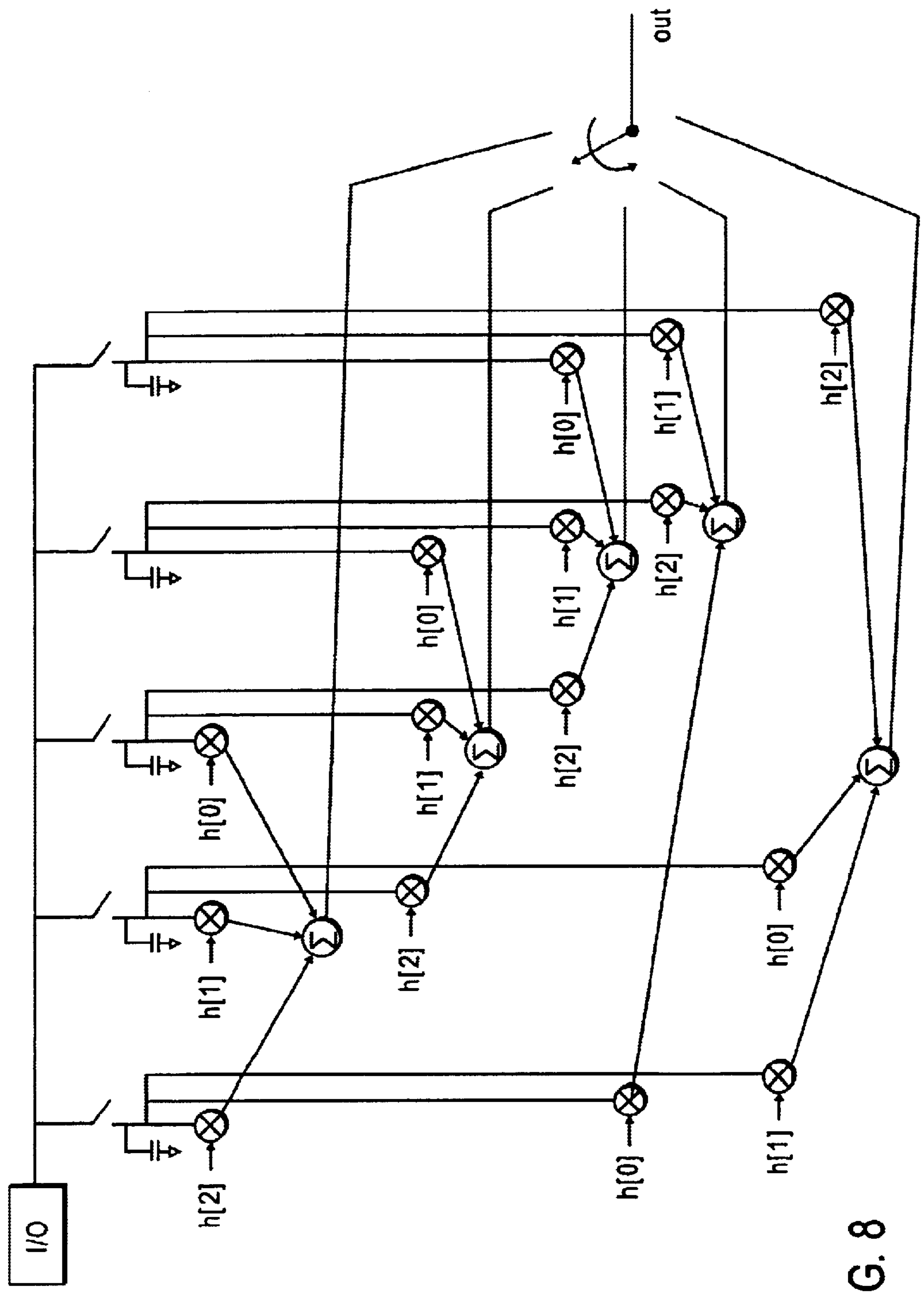
FIG. 8 is another filter architecture without weight shifting.

The filter structure of FIG. 8 is similar to that of FIG. 7, except that another SH circuit has been added. The operation of the filter in FIG. 8 is similar to that of FIG. 7, and not be repeated. However, because another SH circuit has been added, these SH circuits may be closed for 2 bit-times before opening to acquire a sample. These time intervals are overlapped, so that for any given bit-time duration, two SH circuits are closed. As a result, the filter structure for FIG. 8 may operate at a higher data rate than that of FIG. 7 for the same process technology.

The filter structures of FIGS. 7 and 8 avoid the use of a finite state machine for shifting weights and the use of switches of the type 512*a–d* at the expense of repeating filter taps. For many applications, the filter weights alternate in sign. For such applications, a filter structure may be utilized with less multipliers than the structures of FIGS. 7 and 8, without the need for switches of the type 512_a–d_, where filter weight shifting involving like-signed filter weights is used. Before describing in a general way such filter structures, it is pedagogically simpler to first consider an embodiment FIR filter of order 2 as shown in FIG. 9.

Figure 9:
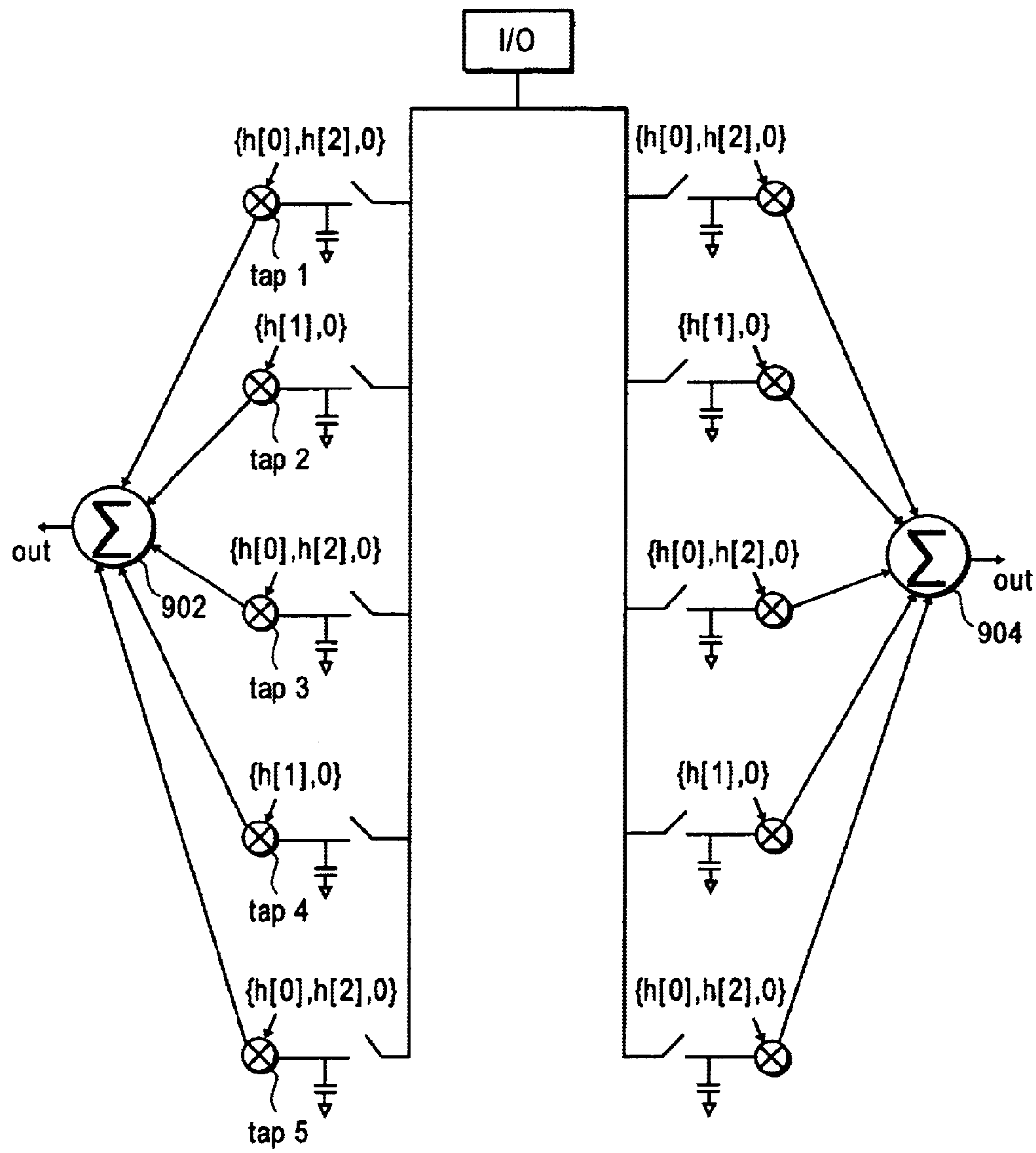
FIG. 9 is a filter architecture with weight shifting, but with simplified complexity.

The filter structure of FIG. 9 shows two banks of SH circuits and taps. It is assumed that filter weights h[0] and h[2] are of one sign, and h[1] is of the opposite sign. Next to each tap is a set of filter weights indicating a sequence of filter weights shifted to that tap. For example, the sequence shifted into tap(1) is denoted by {h[0], h[2], 0}, which means that the repeating sequence of filter weights . . . h[0], h[2], 0, h[0], h[2], 0, . . . is shifted to tap(1). Note that the algebraic sign of the filter weights shifted to any one tap does not change, so that switches of the type 512_a–d_ are note needed. (The sign for 0 may be taken as either positive or negative.)

Figure 10:
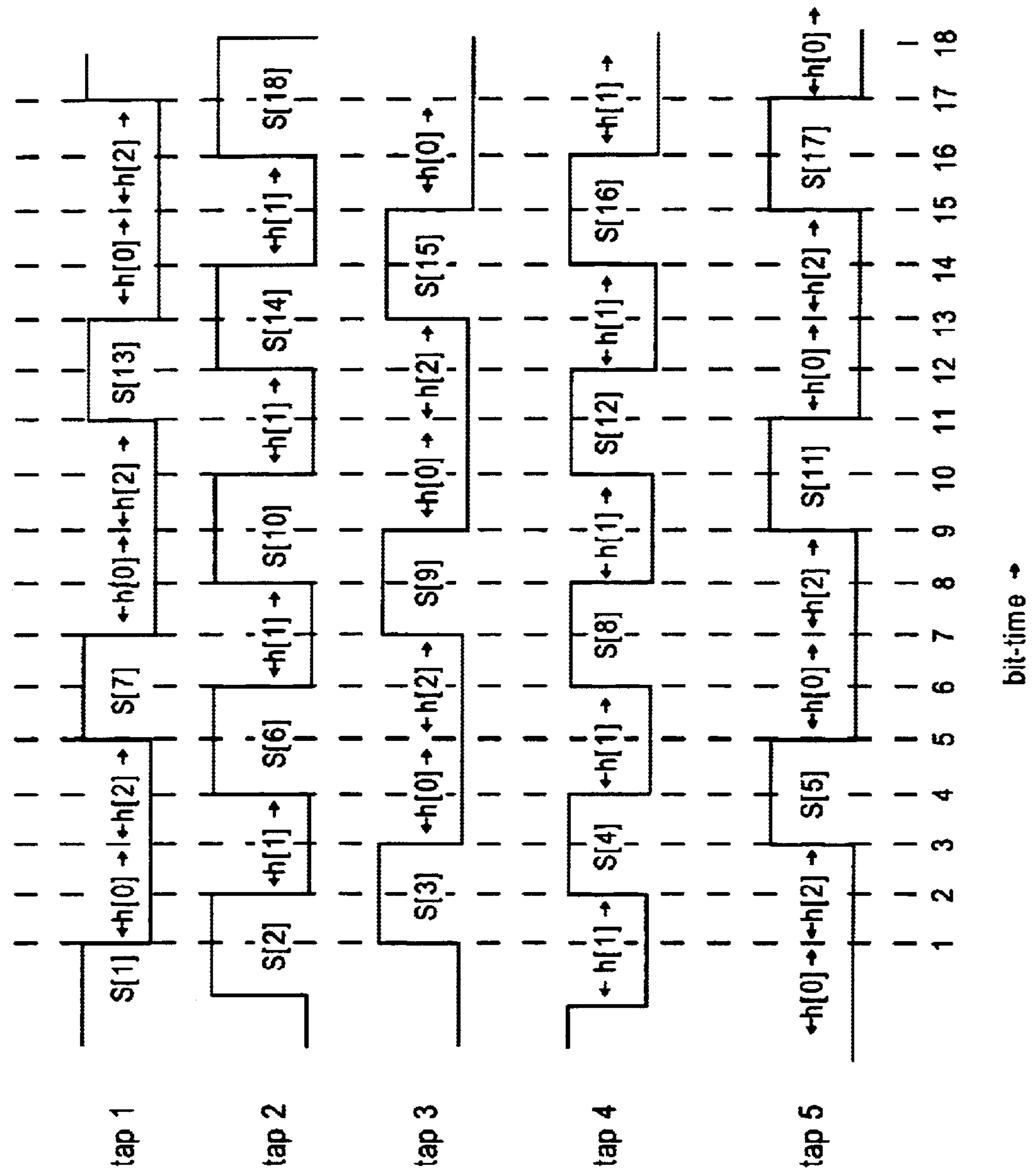
FIG. 10 provides timing information for the filter architecture of FIG. 9.

The timing of the filter weights and SH circuits in FIG. 9 may be explained by referring to FIG. 10. For each indicated tap in FIG. 10, its corresponding timing signal indicates when the corresponding SH circuit is closed (in the processing of acquiring a new sample) and when it is opened (a sample has been acquired and is held). A HIGH signal indicates that a SH circuit is closed, and a LOW signal indicates that a SH circuit is open. The actual acquisition time is indicated by a falling edge of the timing signal. Time is in reference to bit-times, as indicated at the bottom of FIG. 10. Without loss of generality, the bit-times are numbered as indicated. The weight is zero when the SH circuit is closed, otherwise, the weight is indicated next to the timing signal. A SH circuit is closed for a duration of two bit-times. The time duration for each filter weight is two bit-times.

For example, referring to the timing signal corresponding to tap(1), it is seen that the sample s[1] is acquired at bit-time 1 when the timing signal transitions from HIGH to LOW. At bit-time 1, the weight applied to tap(1) is h[0], for a duration of two bit-times. At bit-time 3, the weight h[2] is applied to tap(1), for a duration of two bit-times. The bit-time 5, the SH circuit closes for a duration of two bit times. At bit time 7, the SH circuit opens again to acquire sample s[7]. This process repeats, as indicated in FIG. 10.

At bit-time 3, samples s[1], s[2], and s[3] have been acquired and are available for tap(1), tap(2), and tap(3), respectively. Note that at bit-time 3, filter weight h[0] is being applied to tap(3), filter weight [1] is being applied to tap(2), and filter weight [2] is being applied to tap(1). Multiplication of the filter weights with their corresponding sampled data, followed by summing, results in h[0]s[3]+h[1]s[2]+h[2]s[3], which is the desired filtered output at bit-time 3. (Note that at bit-time 3, a weight of zero is applied to tap(4) and tap(5), so that they do not contribute to the filtered output.)

Inspection of FIG. 10 shows that the desired filtered output is available at every other bit-time, namely, bit-times 3, 5, 7, 9, 11, etc. Consequently, every other filtered output is provided at output port 902 in FIG. 9 at every other bit-time. The timing for the SH circuits and taps on the right hand side of FIG. 9 is identical to that of the left hand side, except that its operation is shifted one bit-time. Consequently, each filtered output is obtained by alternately sampling output ports 902 and 904.

From the above description for FIG. 9, it is seen that each SH circuit need only operate at ½ the bit-rate, and that filtered weights need only be shifted at ½ the bit rate. Furthermore, because each output port is sampled at every other bit-time, the differential latch associated with each summer may operate at ½ the bit-rate. Note that the number of taps for the filter structure of FIG. 9 is less than for the filter structure of FIG. 8, and that only two differential latches are employed. Furthermore, the gate capacitance seen by each SH circuit is less for the filter structure of FIG. 9.

The filter structure of FIG. 9 and its timing operation in FIG. 10 may be generalized to any order filter in which the filter weights alternate in sign, as will now be described. However, before beginning this generalization, some discussion of notation is in order. For simplicity of describing how the sequences are constructed, the sequences are assumed to be one-sided. That is, for any given sequence, there is a first member of the sequence, but not a last member. A one-sided sequence is described by listing an ordered set of elements, such as for example {a,b}, where a and b are variables or constants, which are then repeated in order to generate the sequence. In practice, however, all sequences are really finite in length, so that in the following description and claims, it is to be realized that all sequences used in actual embodiments end when the filter is no longer operated. It is only for simplicity of description and claiming that sequences are treated as one-sided and infinite in length.

Furthermore, for notational simplicity, it is convenient to introduce a weight denoted as NULL. The value of the NULL weight when used by a tap is taken to be zero. The NULL weight is introduced so as to distinguish it from an arbitrary weight, which may just happen to have a value of zero. This distinction is convenient, for in the following description, it is described that a SH circuit opens when the weight to its corresponding tap transitions from the NULL weight to some other weight. But it may happen that the weight transitions from the NULL weight to a weight having a zero value. This distinction between the NULL weight and an arbitrary weight, which may be zero, avoids ambiguity. We now begin with a generalization to the embodiment of FIG. 9 and the timing diagram of FIG. 10.

Let the filter weights for a filter of order N−1 be denoted by h[i], i=0, 1, . . . , N−1. There are two banks of SH circuits and taps, each followed by a summer having an output port. Each bank comprises N+2 SH circuits and taps. For a first bank of SH circuits and taps, label the taps as tap(i), i=1, 2, 3, . . . , N+2. The weight sequences shifted into each tap may be constructed as follows. Let $h_{even}$ denote the ordered set of weights obtained by listing in order only and all of the even-indexed filter weights (0 is taken as an even index), and let $h_{odd}$ denote the ordered set of weights obtained by listing in order only and all of the odd-indexed filter weights. Tap(1) has shifted to it the sequence of weights obtained by repeating in order the weights {$h_{even}$, NULL}. Each weight in the sequence is shifted in at ½ the bit rate. Without loss of generality, let the first weight to tap(1), h[0], be shifted in at bit-time 1. Tap(2) has shifted to it the sequence of weights obtained by repeating in order the weights {$h_{odd}$, NULL}, where the first weight, h[1], is shifted in at bit-time 2.

Sequences for the other taps are easily described in terms of the two sequences for tap(1) and tap(2). For tap(2j+1) (odd-indexed taps), the sequence of weights is the same as for tap(1), except delayed in time by 2j bit-times. For example, the sequence of weights for tap(3) is the sequence obtained by repeating {$h_{even}$, NULL}, where the first weight, h[0], is shifted in at bit-time 2. For tap(2j) (even-indexed taps), the sequence of weights is the same as for tap(2), except delayed in time by 2j bit-times.

Each SH circuit is in its acquisition mode (closed) when the weight to its corresponding tap is the NULL weight.

When the weight to a tap transitions from the NULL weight, its corresponding SH circuit opens to sample. An acquisition mode lasts for two bit-times because the weights for any tap are shifted in at ½ the bit rate.

The second bank of SH circuits and taps are operated in identical fashion to the first bank, except that all timing is delayed by one bit-time. The filtered output are obtained by alternately sampling the output ports, where each output port is sampled at ½ the bit rate.

Figure 11:
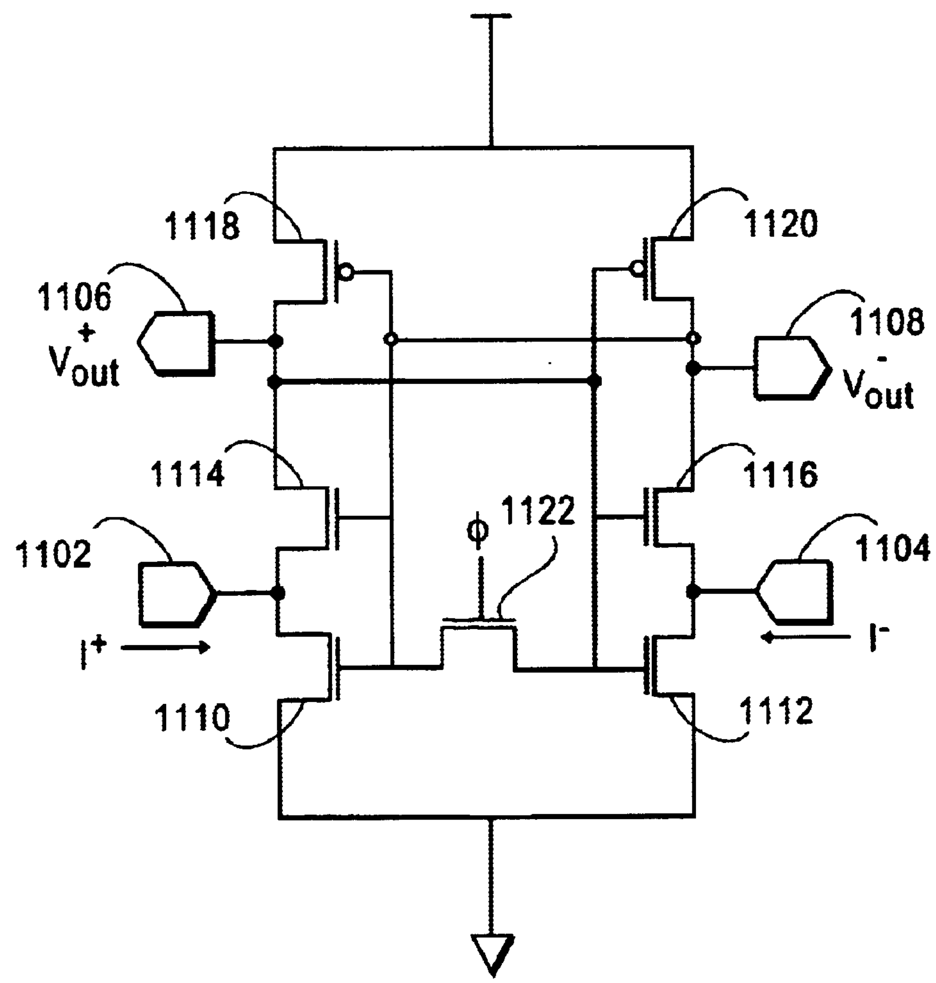
FIG. 11 is an active cascode differential latch at the circuit level.

Referring back to FIG. 5, the combination of resistive loads 514 and 516, and differential latch 522, may be realized by the embodiment of FIG. 11, which may be referred to as an active cascode differential latch. nMOSFETs 1114 and 1116 play the role of active cascode transistors, although they are not cascode transistors in the classical sense because their gate voltages are not biased to a constant voltage. Input port 1102 is connected to one of nodes 518 and 520, and input port 1104 is connected to the other node. A clock signal in FIG. 11 is denoted by $\phi$. When clock signal $\phi$ is HIGH, pre-charge transistor 1122 provides a low impedance path between the gates of transistors 1110 and 1112, pre-charging the differential latch so that the output voltages at output ports 1106 and 1108 are forced to be substantially equal to one another. When clock signal $\phi$ is LOW, pre-charge transistor 1122 switches OFF to put the differential latch in an evaluation mode, where a differential voltage at output ports 1106 and 1108 develops in response to the currents (or voltages) at input ports 1102 and 1104.

If more current is sourced to input port 1102 than is sourced to input port 1104, then the output voltage at output port 1106 increases, and the output voltage at output port 1108 decreases. Cross coupled pMOSFETs 1118 and 1120 are connected as a latch, so that the differential voltage developed at output ports 1106 and 1108 is amplified to a logic level.

The evaluation phase of the differential latch may begin at or just after a bit-time. For example, referring to the timing diagram of FIG. 10, evaluation phases for the differential latch on the left hand side bank in FIG. 9 may begin at odd-indexed bit-times. Consider an evaluation phase beginning at bit-time 3, for example. The filter weight h[0] is available at tap(3) for two bit-times, and the filter weight h[2] is available at tap(1) for two-bit times. However, at bit-time 3, the filter weight h[1] is available at tap(2) for only one more bit-time. Consequently, the differential latch should be designed so that it at least starts to settle to one of its two stable states within one bit time, i.e., a differential voltage starts to develop at output ports 1106 and 1108. At bit-time 4, the NULL weight is provided to tap(2). However, this shouldn't effect the output logic value of the differential latch even if it has not completely evaluated by bit-time 4 because at least a differential voltage has developed. However, before bit-time 5, the differential latch should completely evaluate with enough time left for the pre-charge phase to start and complete by bit-time 5. The entire cycle of an evaluation phase and a pre-charge phase should be no longer than two bit-times for the embodiment represented by FIGS. 9 and 10, as well as its generalization to other embodiments.

An argument similar to that which was made with respect to FIG. 3 shows that device sizes may be easily chosen such that nMOSFETs 1110 and 1112 operate in their triode regions and nMOSFETs 1114 and 1116 operate in their active regions. With nMOSFETs 1110 and 1112 operating in their triode regions, the differential latch of FIG. 11 has a relatively low input impedance, and furthermore, these nMOSFETs require a relatively small amount of headroom voltage. This may be important as supply voltages are scaled lower and lower, because voltage headroom for analog circuit blocks may be a critical issue. A small headroom voltage requirement also improves the input common-mode voltage range of the stages previous to the differential latch, i.e., the V-I converters and current multipliers.

Figure 12:
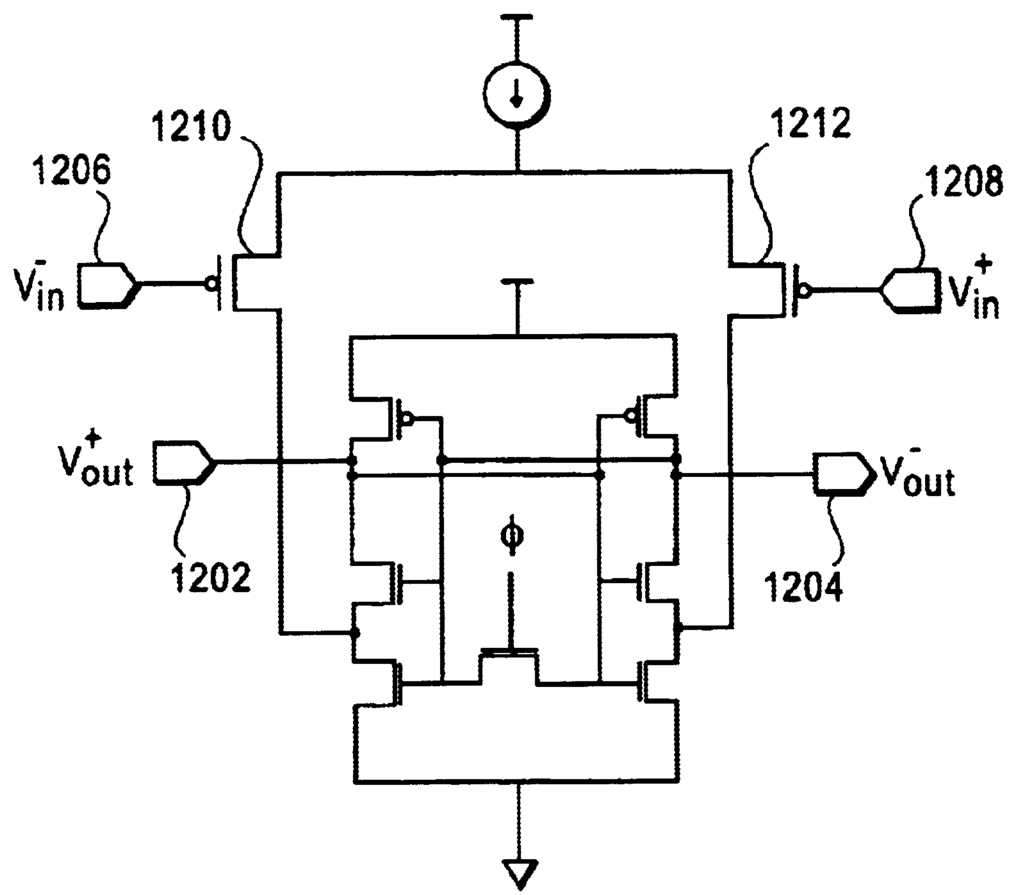
FIG. 12 is a comparator employing the active cascode differential latch of FIG. 11.

The differential latch of FIG. 11 has applications other than for analog filters. More generally, the differential latch of FIG. 11 may find utility for other applications in which a low input impedance is desired for a differential latch having a relatively large common-mode voltage range. For example, the comparator of FIG. 12 utilizes the differential latch of FIG. 11. The differential output voltage at output ports 1202 and 1204 reach one of two logic levels depending upon the differential voltage at input ports 1206 and 1208, which are applied to the gates of pMOSFETs 1210 and 1212.

Figure 13:
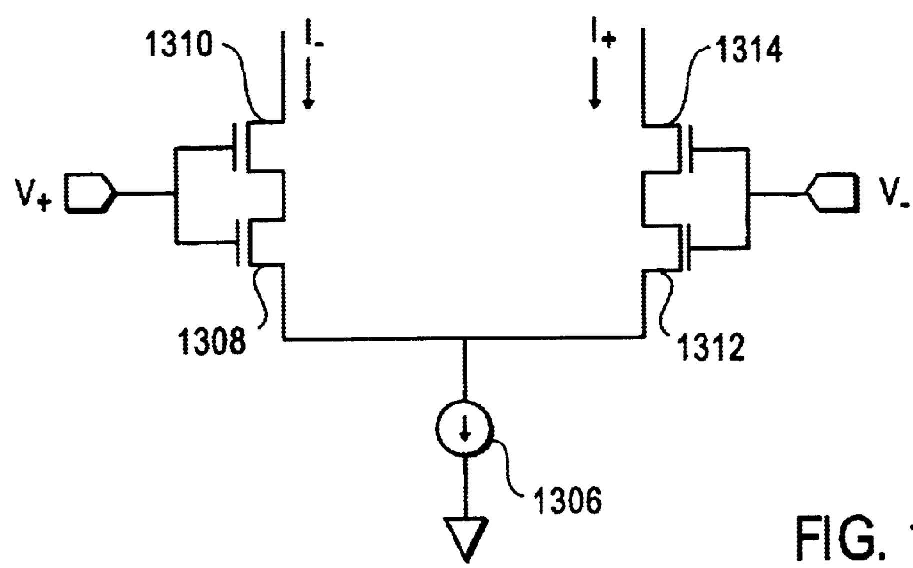
FIG. 13 is a voltage-to-current converter similar to that of FIG. 3 but with current sinks and nMOSFETs.

Many modifications and variations of the disclosed embodiments may be practiced without departing from the scope of the invention as claimed below. For example, given an analog circuit with current sources, pMOSFETs, and nMOSFETs, it is well known that a "dual" or "complementary" circuit exhibiting a similar operation may be synthesized by using current sinks in place of current sources, nMOSFETs in place of pMOSFETs, and pMOSFETs in place of nMOSFETs. As a particular example, consider the V-I converter circuit in FIG. 13, which is the complementary circuit to FIG. 3. By comparing FIG. 13 with FIG. 3, it is easily seen that the operation of the circuit of FIG. 13 is similar to that of FIG. 3, where nMOSFETs 1308, 1310, 1312, and 1314 take the role of pMOSFETs 308, 310, 312, and 314, respectively, and current sink 1306 takes the role of current source 306. Similar modifications may be made to all the disclosed circuits. Consequently, it is to be understood in the claims below that the term "current source" may also mean a "current sink", and that to recite that current is sourced may also mean that the current is sunk.

Figure 14:
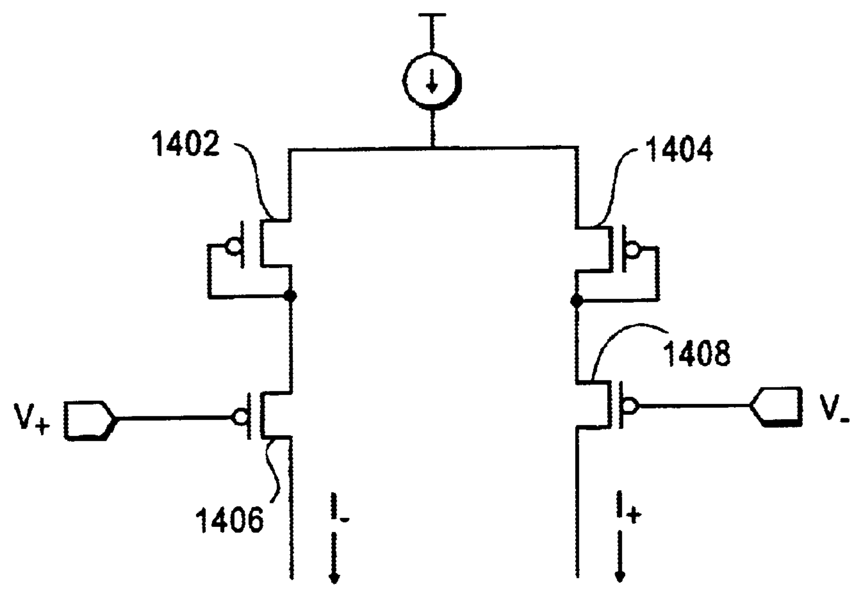
FIG. 14 is another voltage-to-current converter at the circuit level.

FIR filtering may be employed using other embodiments of V-I converters. Referring to FIG. 3, pMOSFETs 310 and 314 may be degenerated in a different manner than using pMOSFETs 308 and 312, respectively, as shown. For example, in FIG. 14, diode-connected pMOSFETs 1402 and 1404 degenerate, respectively, pMOSFETs 1406 and 1408. In other embodiments, resistors may be used for degeneration, or perhaps cascode transistors having their gates at some fixed potential.

It should further be appreciated that the invention claimed below is not necessarily limited to differential signaling. For example, pseudo-differential signaling may be employed, in which a voltage reference is transmitted along with a single-ended signal, or perhaps is generated at the receiver end. In this case, one of the input ports to the V-I converters is fixed at the reference voltage. Consequently, it is to be understood that claiming a differential latch, or claiming a V-I converter with two input ports, does not necessarily imply that differential signaling is employed.

What is claimed is:

1. An active cascode differential latch comprising:

a first input port;

a second input port;

a first transistor of a first conductivity type comprising a gate, and a drain connected to the first input port;

a second transistor of the first conductivity type comprising a gate, and a drain connected to the second input port;

a first active cascode transistor of the first conductivity type comprising a source connected to the drain of the first transistor, and a gate connected to the gate of the first transistor;

a second active cascode transistor of the first conductivity type comprising a source connected to the drain of the second transistor, and a gate connected to the gate of the second transistor;

a load coupled to the first and second active cascode transistors; and a pre-charge transistor to provide a low impedance path between the gates of the first and second transistors only if ON.

2. The active cascode transistor as set forth in claim 1, wherein the load comprises:

a third transistor of a second conductivity type, the second conductivity type complementary to the first conductivity type, comprising a drain connected to the drain of the first active cascode transistor, and a gate connected to the gate of the first active cascode transistor and the drain of the second cascode transistor; and a fourth transistor of the second conductivity type comprising a drain connected to the drain of the second active cascode transistor, and a gate connected to the gate of the second active cascode transistor and the drain of the first cascode transistor.

3. An analog filter comprising:

a voltage-to-current converter comprising a first input port and a second input port, the voltage-to-current converter comprising:

a first drive transistor to conduct a first current $I_1$ and comprising a gate connected to the first input port;

a second drive transistor to conduct a second current $I_2$ and comprising a gate connected to the second input port; and a current source to source a current I to the first and second drive transistors so that the sum of the first current $I_1$ and the second current $I_2$ is substantially equal to the current;

a current multiplier comprising first and second output ports, the current multiplier coupled to the voltage-to-current converter to pass a first weighted current $\alpha I_1$ to the first output port and a second weighted current $\alpha I_2$ to the second output port, where $\alpha$ is a weight; and an active cascode differential latch comprising:

a first input port connected to the first output port of the current multiplier;

a second input port connected to the second output port of the current multiplier;

a first transistor of a first conductivity type comprising a gate, and a drain connected to the first input port;

a second transistor of the first conductivity type comprising a gate, and a drain connected to the second input port;

a first active cascade transistor of the first conductivity type comprising a source connected to the drain of the first transistor, and a gate connected to the gate of the first transistor;

a second active cascode transistor of the first conductivity type comprising a source connected to the drain of the second transistor, and a gate connected to the gate of the second transistor; and a load coupled to the first and second active cascode transistors.

4. The analog filter as set forth in claim 3, wherein the load comprises:

a third transistor of a second conductivity type, the second conductivity type complementary to the first conductivity type, comprising a drain connected to the drain of the first active cascode transistor, and a gate connected to the gate of the first active cascode transistor and the drain of the second cascade transistor; and a fourth transistor of the second conductivity type comprising a drain connected to the drain of the second active cascode transistor, and a gate connected to the gate of the second active cascode transistor and the drain of the first cascode transistor.

5. The analog filer as set forth in claim 4, the active cascode differential latch further comprising:

a pre-charge transistor to provide a low impedance path between the gates of the first and second transistors only if ON.

6. The analog filter as set forth in claim 3, the active cascode differential latch further comprising:

a pre-charge transistor to provide a low impedance path between the gates of the first and second transistors only if ON.

7. A comparator comprising:

a differential pair of transistors to provide a first current and a second current in response to a differential voltage;

an active cascode differential latch comprising:

a first input port to receive the first current;

a second input port to receive the second current;

a first transistor of a first conductivity type comprising a gate, and a drain connected to the first input port;

a second transistor of the first conductivity type comprising a gate, and a drain connected to the second input port;

a first active cascode transistor of the first conductivity type comprising a source connected to the drain of the first transistor, and a gate connected to the gate of the first transistor;

a second active cascode transistor of the first conductivity type comprising a source connected to the drain of the second transistor, and a gate connected to the gate of the second transistor;

a load coupled to the first and second active cascode transistors; and a pre-charge transistor to provide a low impedance path between the gates of the first and second transistors only if ON.

8. The comparator as set forth in claim 7, the load comprising:

a third transistor of a second conductivity type, the second conductivity type complementary to the first conductivity type, comprising a drain connected to the drain of the first active cascode transistor, and a gate connected to the gate of the first active cascode transistor and the drain of the second cascode transistor; and a fourth transistor of the second conductivity type comprising a drain connected to the drain of the second active cascode transistor, and a gate connected to the gate of the second active cascode transistor and the drain of the first cascode transistor.

9. A computer system comprising:

a board comprising a first transmission line and a second transmission line; and a receiver coupled to the first and second transmission lines, the receiver comprising an active cascode differential latch, the active cascode differential latch comprising:

a first input port;

a second input port;

a first transistor of a first conductivity type comprising a gate, and a drain connected to the first input port;

a second transistor of the first conductivity type comprising a gate, and a drain connected to the second input port;

a first active cascode transistor of the first conductivity type comprising a source connected to the drain of the first transistor, and a gate connected to the gate of the first transistor;

a second active cascode transistor of the first conductivity type comprising a source connected to the drain of the second transistor, and a gate connected to the gate of the second transistor;

a load coupled to the first and second active cascode transistors; and a pre-charge transistor to provide a low impedance path between the gates of the first and second transistors only if ON.

10. The computer system as set forth in claim 9, wherein the load comprises:

a third transistor of a second conductivity type, the second conductivity type complementary to the first conductivity type, comprising a drain connected to the drain of the first active cascode transistor, and a gate connected to the gate of the first active cascode transistor and the drain of the second cascode transistor; and a fourth transistor of the second conductivity type comprising a drain connected to the drain of the second active cascode transistor, and a gate connected to the gate of the second active cascode transistor and the drain of the first cascode transistor.

* * * * *